United States Patent [19]

Campbell et al.

[11] Patent Number: 5,572,075

[45] Date of Patent: Nov. 5, 1996

[54] SAFETY INTERLOCK APPARATUS

[76] Inventors: Jeffrey Campbell, 109 Temple St., Rutland, Vt. 05701; Michael Kellogg, 65 South St., Proctor, Vt. 05765

[21] Appl. No.: 295,263

[22] Filed: Aug. 24, 1994

[51] Int. Cl.$^6$ ................................................. H02H 7/00
[52] U.S. Cl. ................ 307/328; 192/129 A; 340/825.31
[58] Field of Search .................................... 307/326, 327, 307/328, 112, 113, 115, 125; 192/129 A, 129 B; 340/825.31, 825.32, 428

[56] References Cited

U.S. PATENT DOCUMENTS

| | | | |
|---|---|---|---|
| 4,396,914 | 8/1983 | Aston | 340/825.31 |
| 4,766,433 | 8/1988 | Herman et al. | 340/825.31 |
| 5,119,065 | 6/1992 | Wiehagen | 340/428 |

Primary Examiner—William M. Shoop, Jr.
Assistant Examiner—Jonathan S. Kaplan
Attorney, Agent, or Firm—William B. Ritchie

[57] ABSTRACT

A safety interlock apparatus which prevents a machine from operating whenever any of the interlocking conditions are not satisfied. The apparatus provides two levels of protection, where both levels must be satisfied before permitting power to be supplied to the device. The first level is provided by a novel fiber optic switch which cannot be defeated or bypassed in normal operating situations. The switch includes a fiber optic "lock" that must be mated with an infrared "key". The second level of protection involves the monitoring of the AC voltage at the load. For interlock system to be satisfied no voltage can exist without the first level of protection also being satisfied.

11 Claims, 8 Drawing Sheets

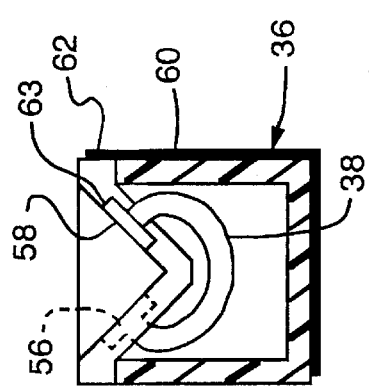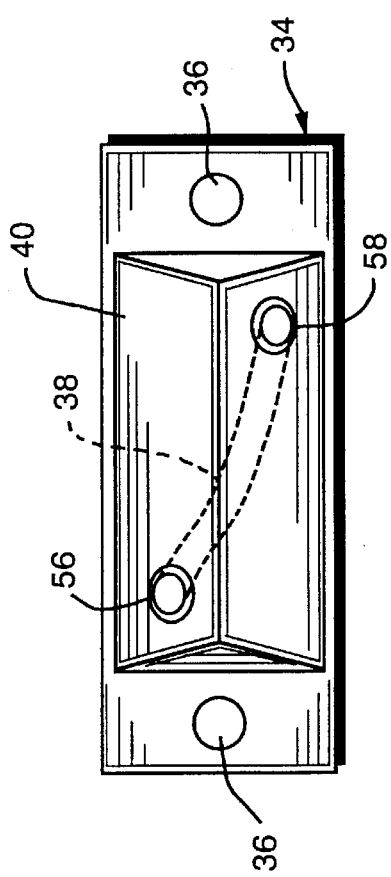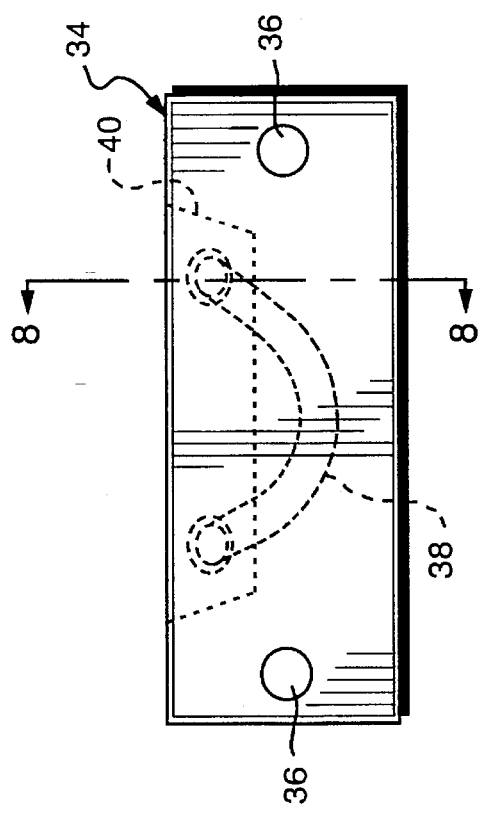

SAFETY INTERLOCK APPARATUS

BACKGROUND OF THE INVENTION

1. Field of the Invention

The invention relates to apparatus for safety switches for devices requiring electrical power.

2. Description of the Related Art

To ensure that various types of machinery are operated safely, machinery is typically provided with a safety interlock so that the machine cannot be operated if one or more of the safety mechanical guards, gates, covers, etc are not properly in position. The most challenging problem is that present safety interlocking devices may be defeated by bypassing the safety interlock scheme. The effort required to defeat a specific interlocking scheme is dependent upon the expertise of the person and sophistication of the scheme. The defeating of a safety interlock will permit a device to operate even though a potentially hazardous condition exists. The bypassing of a safety interlock may lead to personnel safety concerns, equipment damage, production downtime, and raw material loss to mention a few of the potential adverse affects.

A substantial number of devices have been developed for providing a safety interlocking feature to machinery. The devices may range from relatively simple mechanically operated devices to sophisticated combinations of mechanical and electrical devices.

A relatively simplistic interlocking scheme involves the practice of utilizing a mechanical apparatus, such as a limit switch or a combination of limit switches. A limit switch may consist of a lever arm, rotating cam and electrically rated contact(s). Typical installation would involve the mounting of the limit switch and the electrical connections consisting of raceway, conductors and incorporation into a control circuit. Depending on the scheme, a lever may be actuated when the equipment is in a safe operating position. When the lever is actuated it will cause a change in the state of the electrical contact, to be either opened or closed. The electrical contact being incorporated into the control circuit, will permit the operation of the equipment only if the remaining electrical prerequisites are satisfied. This scheme of interlocking may be easily bypassed by physically setting the limit switch in the pseudo-safe position by an external method, such as the use of a rubber band or tape, as opposed to placing the equipment in its safe operating position.

A purely mechanical interlock may involve the use of a dedicated key and several locking mechanisms. A system may consist of a dedicated key and three mechanisms. Two mechanisms may be mounted in the vicinity of the equipment, such as mounted on movable guards or located on a specific component of the equipment such as a cover. A third mechanism may be located adjacent to the electrical power source in a position such that in a de-actuated position the power is not available.

Theoretically, power is available to equipment only when all the conditions required by the mechanical interlock are satisfied. The mechanical interlock is designed such that the equipment is in a safe operating position. For example, when two halves are interconnected this is the only position which permits a dedicated key to be removed. When a dedicated key is removed the two halves can not be separated. The dedicated key is then used to actuate the third mechanism, permitting the power source to be available to the equipment. At this stage, the dedicated key then is held in the third mechanism and can only be removed from the mechanism when de-actuated, removing power from the equipment.

The dedicated key can be used to separate the two halves of the locking mechanism, located in the vicinity of the equipment. At this position, power to the equipment is not available. This scheme, or a similar version, is easily defeated by the use of duplicate key(s).

The purely mechanical mechanism, described above, may also provide electrical rated contacts that may be electrically wired into the control circuit of the equipment. This scheme provides both a mechanical and electrical interlock. The additional hierarchy of interlocking is also defeatable by the use of duplicate key(s).

A purely electrical interlocking scheme is available. For example, a separate piece of equipment must be either energized or de-energized before permitting another separate piece of equipment to be controlled. The interlocking scheme is accomplished by the electrical control wiring interconnection between all associated equipment. This system may be bypassed by a person knowledgeable in the electrical field and aware of the specifics of the particular control circuits of the equipment.

Most American made machines utilize push button switches or magnetic switches that can be easily defeated. A popular mechanical safety interlock switch that is frequently used on machines manufactured in Europe is made by Schmersal in Germany. The most common model of this device is easily bypassed with two paper clips. Another mechanical switch, similar to the Schmersal switch is made by EJA of England. This "ferro-resonant" model is said to be non-bypassable but it is extremely expensive . . . $550 for one 24 volt 2 amp switch. This high price makes it impracticable for most machinery applications.

A safety interlock apparatus having a switch that cannot be easily defeated in accordance with newly issued ANSI and European Standards for machine builders, that can be retrofitted to older equipment as well as incorporated as part of new machinery, that has a switch that is self-aligning with no mechanical parts to wear out, and is inexpensive to manufacture is currently not available.

SUMMARY OF THE INVENTION

It is an object of the invention to provide a safety interlock apparatus that requires predetermined conditions to be satisfied prior to permitting electrical power to be supplied to the equipment.

It is another object of the invention to provide a safety interlock apparatus which has a transmitting apparatus and a detecting apparatus that must be interconnected before satisfying the interlock prerequisites.

It is another object of the invention to provide a safety interlock apparatus that has a secondary safety interlock which monitors the voltage to the load. If voltage is sensed and the interlocking scheme is not satisfied the control circuit will remove the power to the load.

Finally, it is an object of the invention to provide a safety interlock apparatus that requires such a degree of effort and knowledge to defeat it that it can be considered as unbypassable for all practical intents and purposes.

The invention is a safety interlock apparatus for a device requiring electrical power. A first assembly is provided that has a first emission face and a first detecting face. Each of said faces forms a predetermined uncommon first surface. Said first assembly has electromagnetic emission means for emitting an electromagnetic signal from the first emission face of said first assembly. Said first assembly also has electromagnetic detection means for detecting the signal provided by said electromagnetic emission means on the first detecting face of said first assembly. A second assembly is provided. Said second assembly has a second emission face corresponding to said first emission face and has a second detecting face corresponding to said first detecting face. Each of said second faces forms a predetermined uncommon second surface. Said second assembly further is provided with transmission means for transmitting the signal provided by said electromagnetic emission means from said second emission face on said second assembly to said second detecting face on said second assembly. When said first surface of said first assembly is releasably mated with said second surface of said second assembly, said signal from said emission means can be transmitted to said detecting means thereby providing a connected condition. When said first surface is not releasably mated with said second surface of said second assembly, said signal from said emission means cannot be transmitted to said detecting means thereby providing an unconnected condition. Switching means is provided and is connected to said first assembly. Said switching means turns on power to said device when a connected condition exists and turns off power to said device when an unconnected condition exists.

BRIEF DESCRIPTION OF THE DRAWINGS

FIG. 6 is a detailed top view of the fiber optic half of the safety switch.

FIG. 7 is a detailed side view of the fiber optic half of the safety switch.

FIG. 8 is a detailed cross-sectional view along section BB shown in FIG. 7.

DETAILED DESCRIPTION OF THE INVENTION

Figure 1:
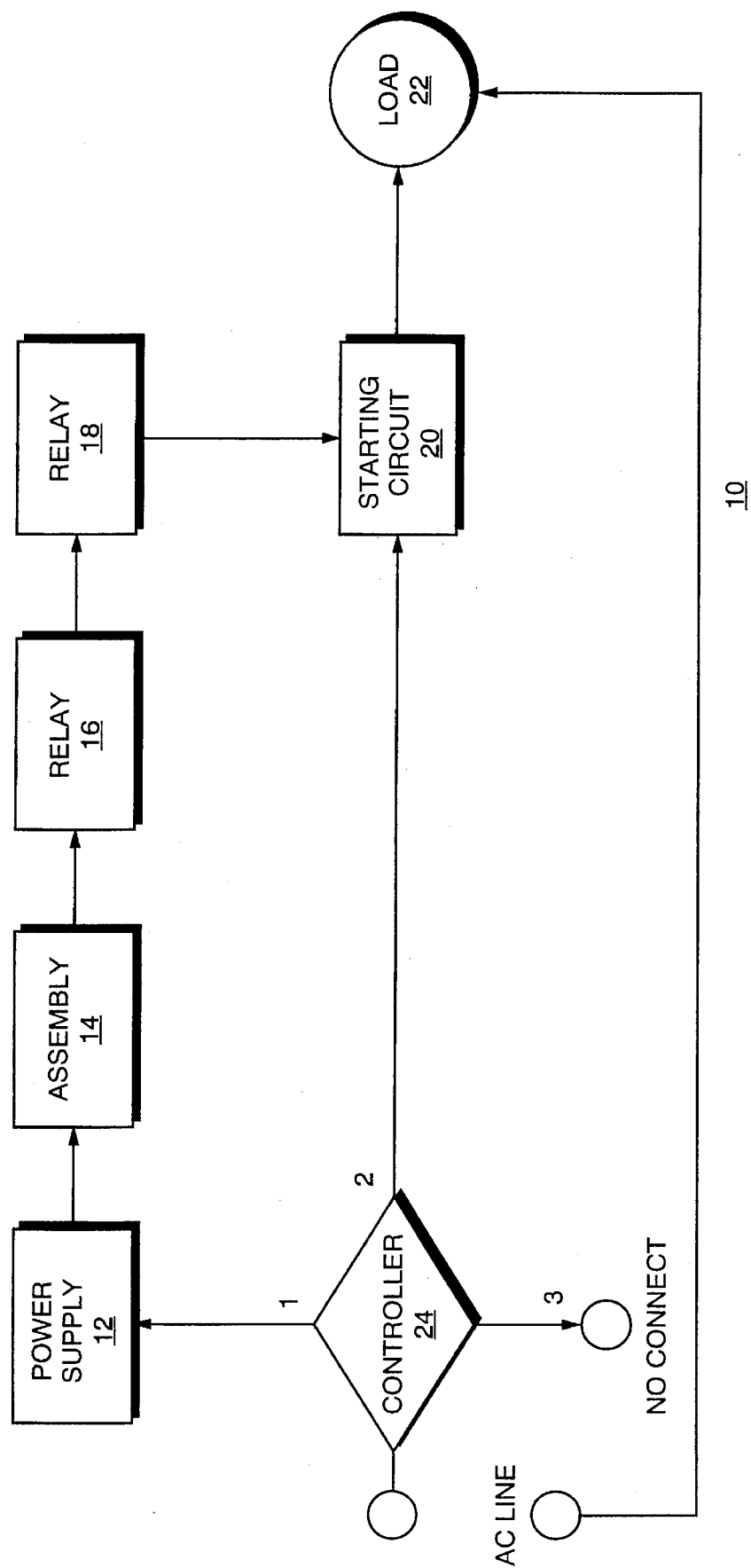
FIG. 1 is a block diagram of the safety interlock apparatus in accordance with the invention.

The invention is a safety interlock apparatus that will turn off electrical current to the machine when a machine guard or other safety device is opened or not in its proper position. Further, a machine operator cannot defeat the switch in any reasonable practical manner. FIG. 1 is a block diagram of invention 10. Invention 10 has two major components . . . on/off controller 24 and safety switch assembly 14.

Controller 24 has three modes of operation. Mode I is the "run". In mode 1, if safety switches in assembly 14 are closed, load 22 can be turned on or off by buttons which operate standard motor starting circuit 20. If Safety switches in assembly 14 are open, power to load 22 will cease. In mode 1, relays 16 and 18 must be properly configured in order for motor starting circuit 20 to be enabled. Relay 16 is controlled by the circuity in assembly 14 and relay 18 is controlled by a logic circuit which compares the status of switches in assembly 14 to the AC voltage going to starting circuit 20. Relay 18 acts as a backup in the event of failure of relay 16. Switch assembly 14 and relays 16 and 18 are powered by regulated power supply 12.

Mode 2 is the "maintenance" mode. In mode 2, a key is required to enter this mode. Power to starting circuit 20 will be present even if safety switches 14 are open. This mode is necessary since some maintenance operations require that the machine be operable without the safety devices in position.

Mode 3 is the "lockout" mode. A key is required to enter this mode. In mode 3, starting circuit 20 is locked out from power so the machine (load 22) is inoperable.

Figure 2:
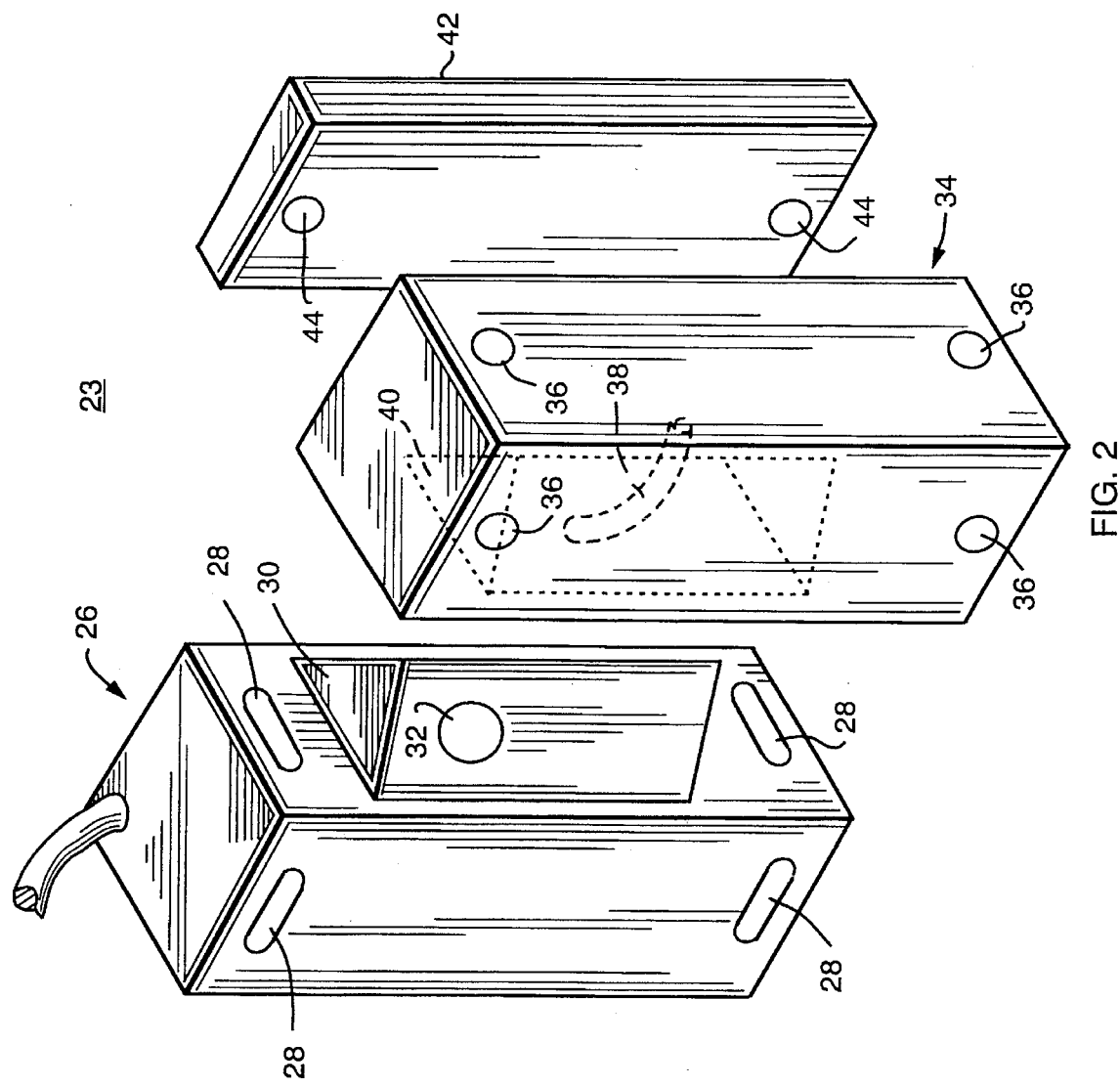
FIG. 2 is an isometric view of the fiber optic safety switch.

FIG. 2 is an isometric view of fiber optic safety switch 23 which is the principal component of switch assembly 14. While switch 23 is ideal for use as a component of an interlock system, it also provides significant advantages for other applications independent of safety interlocking mechanisms. Switch 23 comprises two mating halves . . . IR assembly 26 and fiber optic assembly 34.

Figure 3:
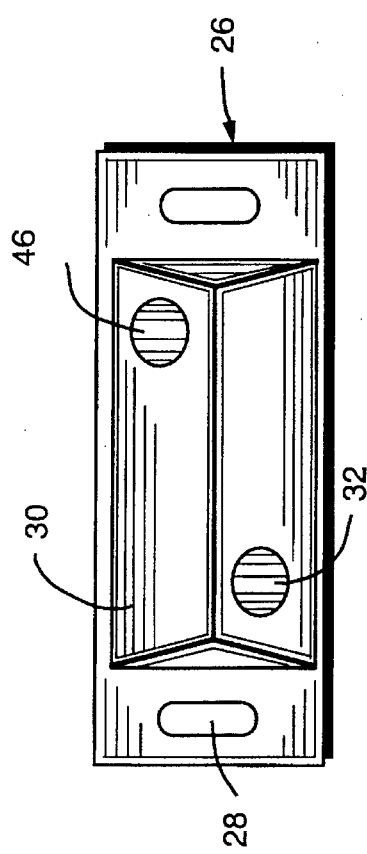
FIG. 3 is a detailed top view of the IR half of the safety switch.

IR assembly 26 features triangular prism-shaped projection 30 which houses LED 32 and photodetecting transistor 46 (shown in FIG. 3). LED 32 is preferably an infrared high output LED such as manufactured by Radio Shack, Archer SY-IR532 Gallium Aluminum Arsenide Super-High Output Infrared Emitting Diode, however, other sources of light which can be detected by photodetecting transistor 46 or its equivalent are also suitable. Mounting slots 28 enable assembly 26 to be mounted on the machine that is to be safety interlocked.

Fiber optic assembly 34 provides the other half of switch 23. Assembly 34 provides triangular prism-shaped recess 40 which mates with projection 30. Fiber 38 is positioned within recess 40 so that the ends of fiber 38 mate with emitter 32 and detector 46 when projection 30 is positioned within recess 40. Mounting holes 36 enable assembly 34 to be mounted to a machine.

Optional mounting plate 42 can be used to mount assembly 34 on thin sheet metal or welded wire guards which are to be "safety interlocked".

While the shape of a triangular prism is preferred for projection 30 and mating recess 40, other mating polyhedron shapes could easily be substituted and would work just as well. The uncommon shape providing a lock and key approach makes it extremely unlikely that a bypass can be used. With the additional requirement of fiber 38 needed to make the optical connection between emitter 32 and detector 46, the possibility of bypassing switch 23 is impractical under all reasonable circumstances.

Figure 5:
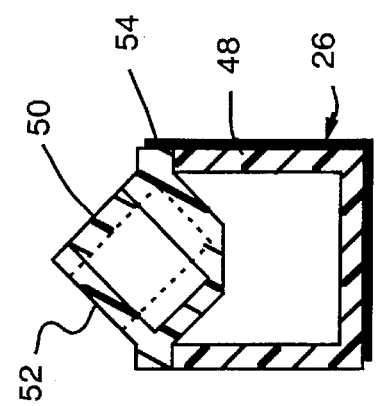
FIG. 5 is a detailed cross-sectional view along section AA shown in FIG. 4.
Figure 4:
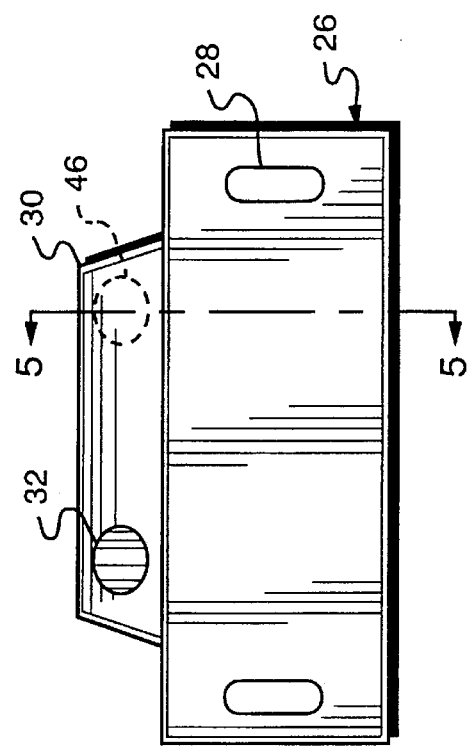
FIG. 4 is a detailed side view of the IR half of the safety switch.

Referring now to FIGS. 3 through 5, a detailed top view of IR assembly 26 of safety switch 23 is shown. The positioning of emitter 32 and detector 46 is not critical but should be on different faces of polyhedron-shaped projection 30 that is used as the key so as to make the likelihood of bypassing switch 23 much more difficult.

The dimensions of switch 23 are not critical and will vary with the particular application or device that is to be protected. Typically, assembly 26 is about 2 inches long and ¾ inches wide, with projection 30 about 1¼ inches long and ⅜ inches high. However, given the size advantages provided by fiber optics, switch 23 could be made extremely small. For example, opening 50 which corresponds to emitter 32 is preferably about ¼ inch in diameter for the example presented herein. Opening 52 is also preferably ¼ inch. This is the size necessary to accommodate emitter 32 and detector 46. However, it is not essential that emitter 32 and detector 46 connect directly to fiber 38 in assembly 34. Another section of fiber could be used to optically connect emitter 32 to the surface of projection 30 and likewise with detector 46, thus the size of assembly 26, i.e., the "key" portion could be made exceedingly small if so required. Likewise, the size of the "lock" portion, i.e., assembly 34 could be similarly reduced.

Assembly 26 is preferably made in at least two sections as shown in FIG. 5. U-shaped portion 48 is approximately ¾ of inch on each side, having a wall thickness of about 3/32 of an inch. Projection 30 is then expoxied onto portion 48 to form assembly 26. Construction materials are not critical but a hard plastic such as VALOX® mechanically tough and corrosion resistant engineering thermoplastic made by General Electric is preferred.

Referring now to FIGS. 6 through 8, a detailed top view of the fiber optic assembly 34 of safety switch 23 is shown. As noted above, recess 40 is sized to mate with projection 30. Fiber optic connection port 56 is positioned to match emitter 32 and fiber optic connection port 58 is positioned to match detector 46 so that once projection 30 is fitted within recess 40, an optical connection via fiber 38 is made between emitter 32 and detector 46. As with assembly 26, assembly 34 is preferably made from two parts. U-shaped housing 60 matches that of U-shaped housing 48 except that mounting holes 36 are provided. Holes 36 affix assembly to the moving guards of the machine using two piece ratcheting rivets or the equivalent (not shown) so as to be tamper resistant.

Slots 28 in assembly 26 are used to allow for adjustment in the case of improper placement of mounting holes on machine or wearing of moving guard hinges, rollers etc. . . Housing 62 which provides recess 40 is expoxied to housing 60 to form assembly 36.

Each end of fiber 38 is fastened to housing 62 through 0.100 diameter hole with a counter bore 63. Counter bore 63 is then filled with clear epoxy to hold fiber 38 in place yet provide an optical connection to its respective emitting or detecting element in assembly 26.

Figure 9:
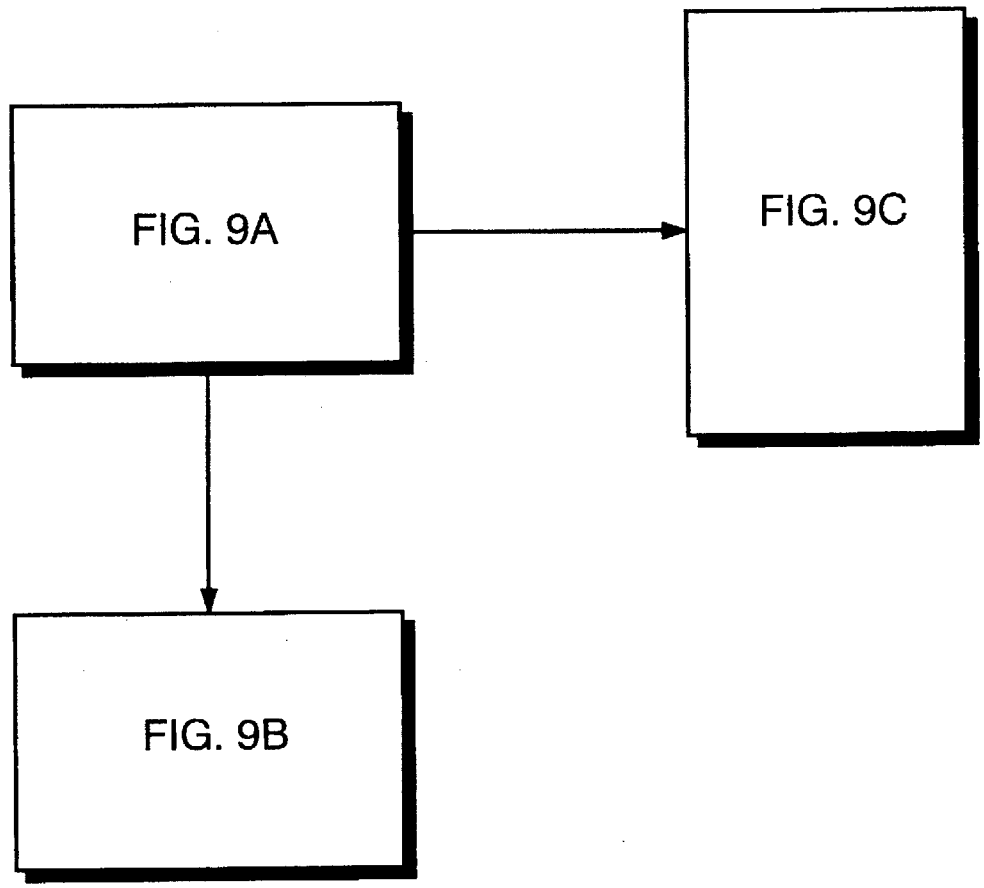
FIG. 9 is a schematic that details the electronic circuitry of the safety interlock apparatus in accordance with the invention.
Figure 9A:
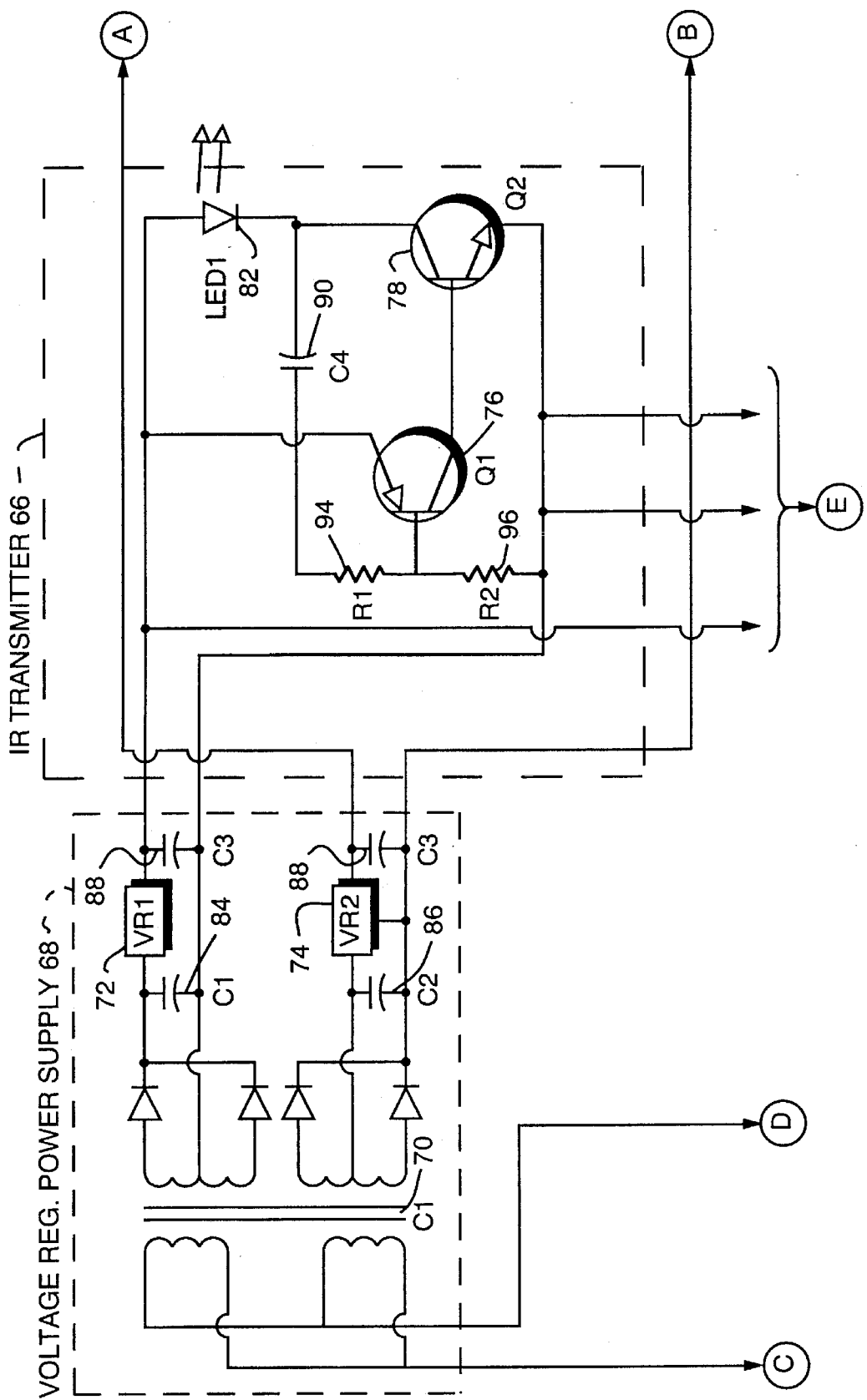
Figure 9B:
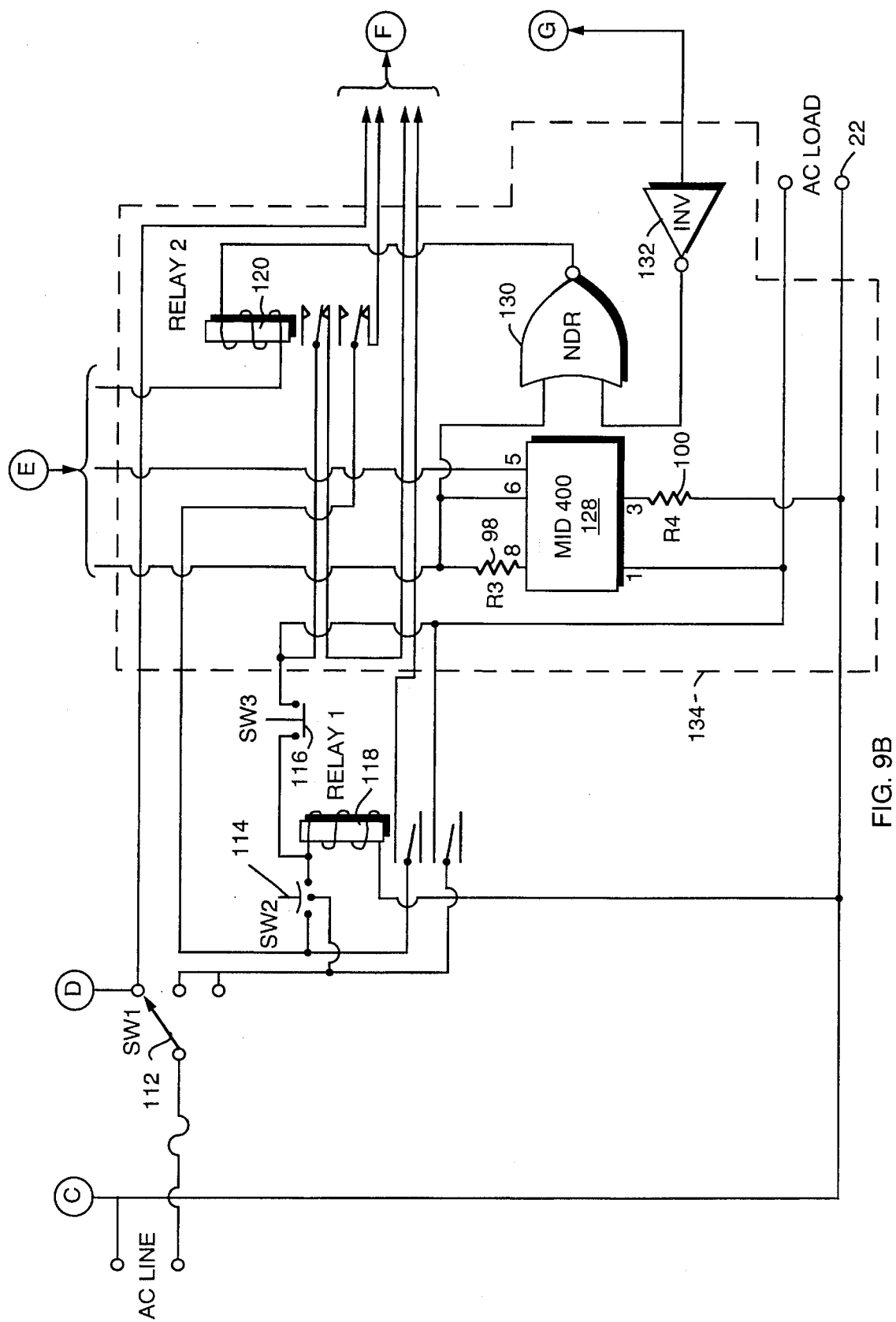
Figure 9C:
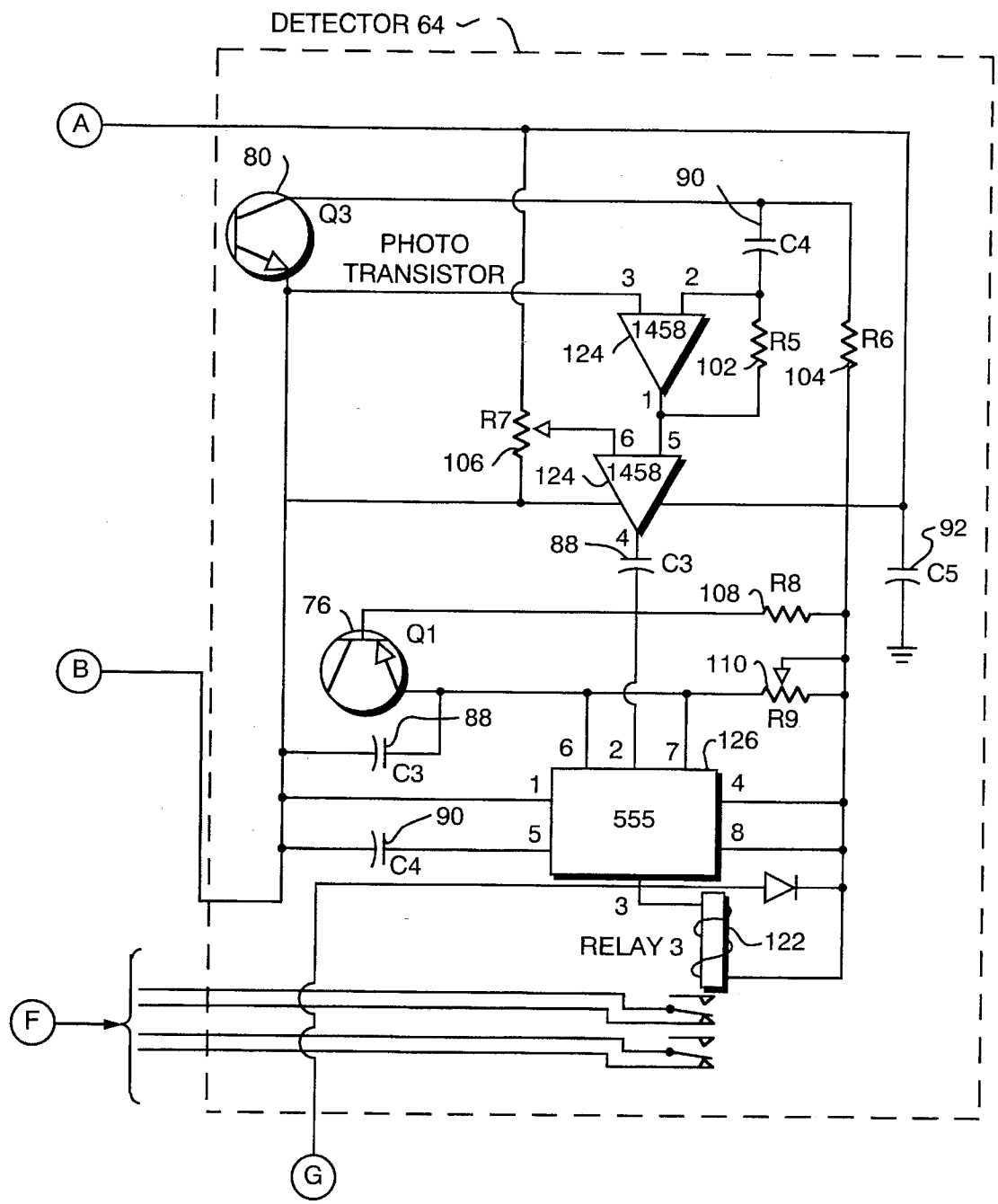

FIG. 9 is a schematic that details the electronic circuitry of invention 10. While the following circuit description is utilizes the preferred components, the invention can be made compatible with any 24 VDC system by the proper selection of step down resistors and relays in the device.

Power supply 68 is a regulated supply that generates +6 VDC with a +/−10% ripple via voltage regulator 72 and +9 VDC via voltage regulator 74. Transformer 70 is preferably a 25 volt, dual output, center tapped transformer. Capacitor 84 is rated 1350 μf, capacitor 86 is rated 915 μf and capacitors 88 are 0.1 μf.

Switch 112 is preferably a three position keyed switch as described above. Switch 114 is a push button type of switch that is normally open. Switch 116 is also a push button type of switch that is normally closed.

IR transmitting circuit 66 generates approximately 240 pulses per second each 400 milliseconds in duration with an amplitude of 400 milliamps. Transistor 76 is PNP type such as Archer MPS2907 transistor by Radio Shack. Transistor 78 is an NPN type such as Archer 2N2222 transistor by Radio Shack. LED 82 is, as noted above, is preferably a high output infrared emitting diode. Infrared is used to further enhance the non-bypassability of the device plus make it less sensitive to ambient light. A glass fiber optic is used in assembly 34 as this is the only fiber type to transmit IR light. Other light sources matched with plastic fiber optics could be used but would diminish the non-bypassability of the device. Plastic fibers will transmit light effectively with only cut ends whereas glass fiber optics need to be cut and polished on the ends to effectively transmit IR light.

Capacitor 90 is rated at 0.2 μf. Resistors 94 and 96 are rated at 22k and 2.2M ohms, respectively.

Detector circuit 64 detects the near infrared from LED 82 by means of phototransistor 80. Phototransistor 80 is preferably Archer SY-54PTR Infrared Phototransmitter by Radio Shack. The signal produced by phototransistor 80 is amplified via (OP amps) operational amplifiers 124. Suitable for OP amps 124 is model 1458 as manufactured by General Instrument. Timer 126 forms a missing pulse detector that actuates relay 122 when the infrared beam is interrupted. Relay 122 is a DPDT relay, normally closed. Timer 126 is preferably model 555 as manufactured by General Instrument. The circuit is completed with transistor 76, a PNP type specified above. Resistors 102, 104, and 108 are rated at 1M, 100k, 4.7 ohms respectively. Resistor 110 is a variable type and is rated at 1 Mohm. Capacitors 88, 90 and 92 are rated at 0.1, 0.02, and 10 μf, respectively.

In the event that relay 122, a DPDT relay, normally closed, fails, relay 120, also DPDT, normally closed, is actuated by digital logic circuit 134. Input to the logic circuit 134 comes from two sources. The first is a signal from timer 126 in detection circuit 64. The second source is from an AC line monitor 128. Monitor 128 is preferably Model Mid 400 as manufactured by General Instrument. Monitor 128 is an optically isolated AC line-to-logic interface device. The two signals are input into NOR gate 130, such as CMOS integrated circuit model 4001 as manufactured by General Instrument. A resistor-transistor logic circuit, well known in the art, could be substituted. Inverter 132, such as Hex Inverter model 7404 as manufactured by General Instrument, completes the circuit.

In the "RUN" mode, when relays 120 and 122 are properly configured, current is sent to the motor starting circuit where push button switch 114, push button, normally open will then enable load 22. Any subsequent change in the status of relays 120 and 122 will disable load 22 and require the proper configuration of relays 120 and 122 and depressing switch 114 once again to start load 22.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A safety interlock apparatus for a device requiring electrical power comprising:

a first assembly having a first emission face and a first detecting face, wherein said first emission face and said first detecting face are different faces of a polyhedron-shaped projection, and with each of said faces forming a predetermined uncommon first surface of said polyhedron-shaped projection, said first assembly further comprising:

electromagnetic emission means for emitting an electromagnetic signal from the first emission face of said first assembly;

electromagnetic detection means for detecting the signal provided by said electromagnetic emission means on the first detecting face of said first assembly:

a second assembly having a second emission face corresponding to said first emission face and a second detecting face corresponding to said first detecting face, with each of said second faces forming a predetermined uncommon second surface, said second assembly further comprising:

transmission means for transmitting the signal provided by said electromagnetic emission means from said second emission face on said second assembly to said second detecting face on said second assembly such when said first surface of said first assembly is releasably mated with said second surface of said second assembly, said signal from said emission means can be transmitted to said detecting means thereby providing a safe condition and when said first surface is not releasably mated with said second surface of said second assembly, said signal from said emission means cannot be transmitted to said detecting means thereby providing an unsafe condition;

switching means, connected to said first assembly, for turning on power to said device when a safe condition exists and turning off power to said device when an unsafe condition exists.

2. The apparatus of claim 1 wherein said transmission means is an optical fiber.

3. The apparatus of claim 2 wherein said emission means is an light emitting diode.

4. The apparatus of claim 3 wherein said detection means is a photodetecting transistor.

5. The apparatus of claim 4 wherein said first emission face and said second emission face are planar surfaces.

6. The apparatus of claim 5 wherein said first detection face and said second detection face are planar surfaces.

7. The apparatus of claim 6 wherein said first emission face and said first detection face are in the same plane on said first assembly and wherein said second emission face and said detection face are in the same plane of said second assembly, 8. The apparatus of claim 6 further comprising:

sensing means for determining a voltage of said device such that when a voltage to said device is sensed by said sensing means and an unconnected condition exists, said apparatus will disconnect electrical power to said device.

9. The apparatus of claim 8 further comprising:

controller means for enabling an operator to select one of three modes; a run mode which requires a connected condition in order for said device to receive electrical power, a maintenance mode, actuated by a key which permits electrical power to said device even in an unconnected condition, and a lockout mode, actuated by a key, which prevents electrical power from reaching said device.

10. The apparatus of claim 9 wherein said first emission face and said first detection face form a prism-shaped projection and wherein said second emission face and said second detection face form a prism-shaped recess.

11. The apparatus of claim 10 wherein said electromagnetic emission means is optically connected to the first emission face of said first assembly via an emission optical fiber and wherein said electromagnetic detection means is optically connected to the first emission face of said first assembly via an detection optical fiber.

* * * * *